| (12) | United States Patent | (10) Patent No.: | US 9,144,173 B2 |
|---|---|---|---|
| | Chen et al. | (45) Date of Patent: | Sep. 22, 2015 |

(54) SLIDE RAIL ASSEMBLY FOR USE IN RACK SYSTEM AND REINFORCEMENT MEMBER THEREOF

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chun-Chiang Wang, Kaohsiung (TW)

(73) Assignees: King Slide Works Co., Ltd., Kaosiung (TW); King Slide Technology Co., Ltd., Kaosiung (TW)

( * ) Notice: Subject to any disclaimer, the term of this patent is extended or adjusted under 35 U.S.C. 154(b) by 284 days.

(21) Appl. No.: 13/760,230

(22) Filed: Feb. 6, 2013

(65) Prior Publication Data

US 2014/0217049 A1    Aug. 7, 2014

(51) Int. Cl.
*A47B 57/00* (2006.01)
*H05K 7/14* (2006.01)
*A47B 88/04* (2006.01)

(52) U.S. Cl.
CPC ............ *H05K 7/1489* (2013.01); *A47B 88/044* (2013.01)

(58) Field of Classification Search
CPC .... A47B 88/044; A47B 96/06; H05K 7/1421; H05K 7/1489

USPC ................ 211/26, 26.2, 190, 192; 312/334.4, 312/334.5
See application file for complete search history.

(56) References Cited

U.S. PATENT DOCUMENTS

| 2,277,702 | A | * | 3/1942 | Kennedy ..................... 312/334.8 |
|---|---|---|---|---|
| 4,560,212 | A | * | 12/1985 | Papp et al. ....................... 384/18 |
| 4,998,828 | A | * | 3/1991 | Hobbs ............................. 384/18 |
| 6,254,210 | B1 | * | 7/2001 | Parvin ..................... 312/334.46 |
| 6,296,338 | B1 | * | 10/2001 | Stijns ............................ 312/333 |
| 7,178,888 | B2 | * | 2/2007 | Judge et al. .............. 312/334.46 |
| 7,677,679 | B2 | * | 3/2010 | Hsiung et al. .................. 312/333 |
| 8,028,965 | B2 | | 10/2011 | Chen et al. |
| 2006/0152115 | A1 | | 7/2006 | Dubon et al. |
| 2009/0283652 | A1 | * | 11/2009 | Chen et al. ................. 248/298.1 |
| 2012/0087605 | A1 | | 4/2012 | Chen et al. |
| 2012/0087606 | A1 | | 4/2012 | Chen et al. |

* cited by examiner

*Primary Examiner* — Korie H Chan
(74) *Attorney, Agent, or Firm* — Rosenberg, Klein & Lee (57) ABSTRACT

A slide rail assembly includes a slide assembly, a front support, a first rear support, a second rear support, and a reinforcement member. The slide rail assembly includes an outer rail, an inner rail and an intermediate rail. The front support and the first rear support are respectively connected to the front end and the outside of the outer rail. The second rear support is movably connected to the first rear support. The reinforcement member includes a body, two first support parts and at least two second support parts. The body has a slot and a contact portion. The two first support parts embrace the outer rail, and the at least two second support parts embrace the second rear support. The slide rail assembly is installed to the rack. The reinforcement member reinforces the connection between the second rear support and the outer rail.

16 Claims, 6 Drawing Sheets

SLIDE RAIL ASSEMBLY FOR USE IN RACK SYSTEM AND REINFORCEMENT MEMBER THEREOF

FIELD OF THE INVENTION

The present invention relates to a slide rail assembly used in a rack system and a reinforcement member thereof, and more particularly, to a slide rail assembly, having a reinforcement member, whose supports are adjustable to meet requirements of maximum or minimum and to reinforce the structural strength thereof.

BACKGROUND OF THE INVENTION

U.S. Pat. No. 8,028,965 to CHEN discloses an adjustable bracket for a slide assembly which can be installed to different depths of the racks. The amount of the adjustment of the bracket is made by the relative displacement between the cover (30) and the rear support (50). When the rear support is completely retracted to the cover, the total length of the bracket reaches its minimum length. When the rear support is pulled, relative to the cover, to its extreme position, the total length of the bracket reaches its maximum length. However, when the rear support is pulled to its extreme position, the rear support must be partially inserted into the cover so as to maintain the support strength. Accordingly, the length that the rear support inserted in the cover cannot be too short. If the total length of the bracket is to be increased, the length that the rear support is pulled relative to the cover cannot be overly increased so as to maintain a minimum support strength. Consequently, to increase the total length of the bracket, only the two respective lengths of the cover or the rear support can be increased. However, once the length of one of the cover or the rear support is increased, the minimum length of the bracket is increased and cannot meet the original requirement of the minimum length of the support.

The present invention intends to provide a slide rail assembly with a reinforcement member which is adjustable to meet requirements of maximum or minimum and to reinforce the structural strength thereof.

SUMMARY OF THE INVENTION

The present invention relates to a slide rail assembly and comprises an outer rail, an inner rail, a front support, a first rear support, a second rear support and a reinforcement member. The outer rail has a longitudinal length and two side walls are connected two sides of the outer rail. A bridge wall is connected between the two side walls. A longitudinal path is defined between the two side walls and the bridge wall. The inner rail is slidably connected to the longitudinal path of the outer rail. The front support is connected to the front end of the outer rail and secured to the bridge wall. The first rear support is fixed to the bridge wall of the outer rail and has two first support portions and a first side portion is connected between the two first support portions. A first path is defined between the insides of the two first support portions and the first side portion. The second rear support is movably located in the first path of the first rear support. The second rear support has two second support portions and a second side portion is connected between the two second support portions. The reinforcement member has a body, two first support parts and at least two second support parts. The two first support parts and the at least two second support parts extend from the body and toward opposite directions. The two first support parts are connected to the outer rail and embrace the two side walls. The at least two second support parts are connected to the second rear support and embrace the two second support portions.

Preferably, an engaging hole is defined in the rear end of the bridge wall of the outer rail. The body of the reinforcement member has a slot and a contact portion which extends from the body and is inserted into the slot. The contact portion has a protrusion which is engaged with the engaging hole of the outer rail.

Preferably, the second side portion of the second rear support has a side hole and an extension plate extends from the second side portion and is inserted into the side hole. The body of the reinforcement member has a stop which contacts the extension plate of the second rear support.

Preferably, each of the first support parts of the reinforcement member comprises a first support plate and a first bent section. The first support plate substantially extends perpendicularly from the body of the reinforcement and is located on the rear side of the body. The first bent section is bent from the first support plate.

Preferably, each of the at least two second support parts of the reinforcement member comprises a second support plate and a second bent section. The second support plate substantially extends perpendicularly from the body of the reinforcement and is located on the front side of the body. The second bent section is bent from the second support plate.

Alternatively, the present invention relates to a slide rail assembly for use in a rack system and comprises a slide rail assembly which comprises an outer rail having a longitudinal length and two side walls are connected two sides of the outer rail. A bridge wall is connected between the two side walls. A longitudinal path is defined between the two side walls and the bridge wall. An inner rail is slidably connected to the longitudinal path of the outer rail. An intermediate rail is slidably connected between the inner rail and the outer rail. A front support is connected to the front end of the outer rail. A first rear support is fixed to the bridge wall of the outer rail and has two first support portions and a first side portion is connected between the two first support portions. A first path is defined between the insides of the two first support portions and the first side portion. A second rear support is movably located in the first path of the first rear support. The second rear support has two second support portions and a second side portion is connected between the two second support portions. A reinforcement member has a body, two first support parts and at least two second support parts. The body has a rear side and a front side. The rear side of the body is located corresponding to the bridge wall of the outer rail. The front side of the body is located corresponding to the second side portion of the at least two second support parts. The body of the reinforcement member has a slot and a contact portion extends from the body and is inserted into the slot. The first support parts embrace the two side walls of the outer rail. The two first support parts extend from the outer rail and are located on the rear side of the body. The at least two second support parts movably embrace the two second support portions of the second rear support. The at least two second support parts extend from the body of the reinforcement member and are located on the front side of the body. The slide rail assembly is secured to the rack by connecting the front support to the front post of the rack and connecting the second rear support to the rear post of the rack. The reinforcement member is freely adjustable. The contact portion contacts the bridge wall of the outer rail to position the reinforcement member.

One aspect of the present invention is to provide a slide rail assembly wherein the length of the slide rail relative to the depth of the rack can be adjusted so that the slide rail assembly is installed to the rack and has reinforced connection.

The present invention will become more obvious from the following description when taken in connection with the accompanying drawings which show, for purposes of illustration only, a preferred embodiment in accordance with the present invention.

DETAILED DESCRIPTION OF THE PREFERRED EMBODIMENT

Figure 1:
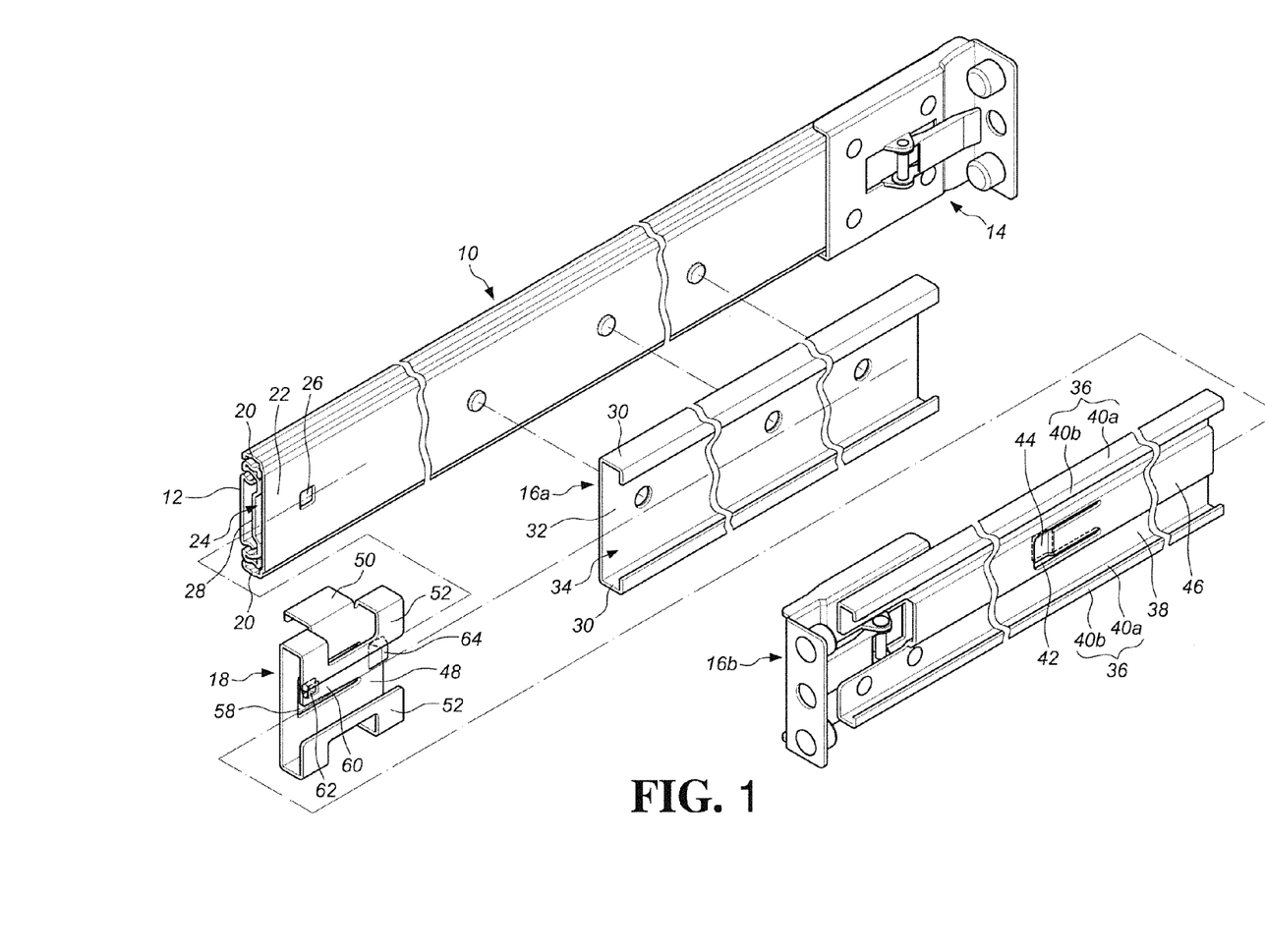
FIG. 1 is an exploded view to show the slide rail assembly of the present invention.

Referring to FIG. 1, the slide rail assembly of the present invention comprises an outer rail 10, an inner rail 12, a front support 14, a first rear support 16a, a second rear support 16b and a reinforcement member 18.

The outer rail 10 has a longitudinal length and two side walls 20 are connected two sides of the outer rail 10. A bridge wall 22 is connected between the two side walls 20. A longitudinal path 24 is defined between the two side walls 20 and the bridge wall 22. Preferably, an engaging hole 26 is defined through the rear end of bridge wall 22.

The inner rail 12 is slidably connected to the longitudinal path 24 of the outer rail 10. Preferably, an intermediate rail 28 is slidably connected between the inner rail 12 and the outer rail 10, so that the inner rail 12 is able to be extended to a longer distance relative to the outer rail 10 by the intermediate rail 28.

Figure 4:
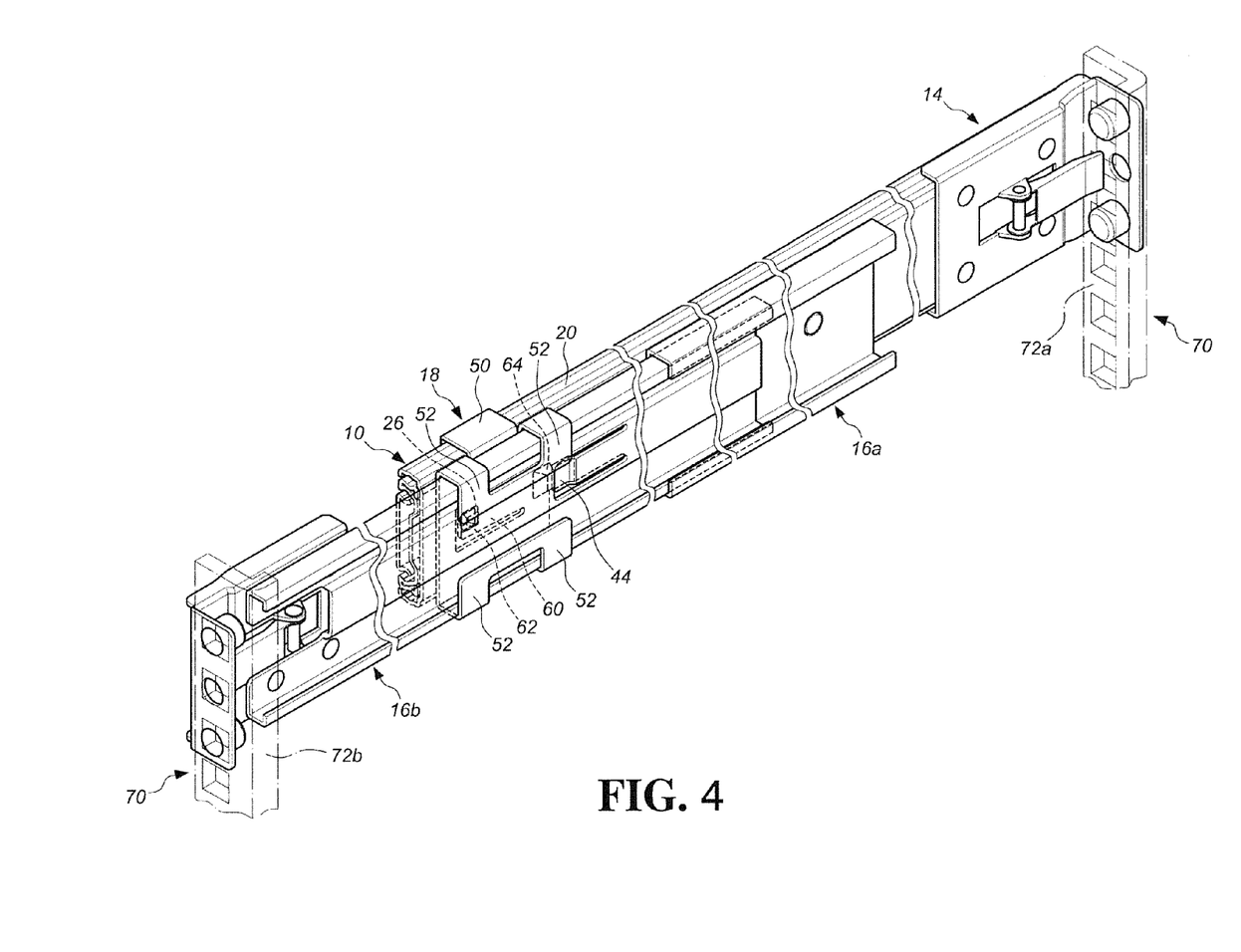
FIG. 4 shows that the slide rail assembly is installed to a rack and the reinforcement member is connected to the rear end of the outer rail.

The front support 14 is connected to the front end of the outer rail 10 and secured to the bridge wall 22. The front support 14 can be installed to a front post 72a (as shown in FIG. 4) on front end of a rack in practical use.

The first rear support 16a is installed to the outside of the bridge wall 22 of the outer rail 10 and comprises two first support portions 30 and a first side portion 32 which is connected between the two first support portions 30. Preferably, the first rear support 16a is fixedly installed to the bridge wall 22. A first path 34 is defined between the insides of the two first support portions 30 and the first side portion 32.

The second rear support 16b is movably installed to the first rear support 16a. Preferably, the second rear support 16b is movably located in the first path 34 of the first rear support 16a. The second rear support 16b has two second support portions 36 and a second side portion 38 which is connected between the two second support portions 36. Each of the two second support portions 36 has a first support section 40a and a second support section 40b. The first support section 40a substantially extends perpendicularly from the second side portion 38. The second support section 40b substantially extends perpendicularly from the first support section 40a.

The second side portion 38 of the second rear support 16b has a side hole 42 and an extension plate 44 which extends from the second side portion 38 and is inserted into the side hole 42. Preferably, a central section 46 protrudes from the second side portion 38 of the second rear support 16b and extends along the lengthwise direction of the second side portion 38 so as to reinforce the strength of the second rear support 16b. In practical use, the second rear support 16b can be installed to the rear post 72b (as show in FIG. 4) on the rear end of the rack.

Figure 2:
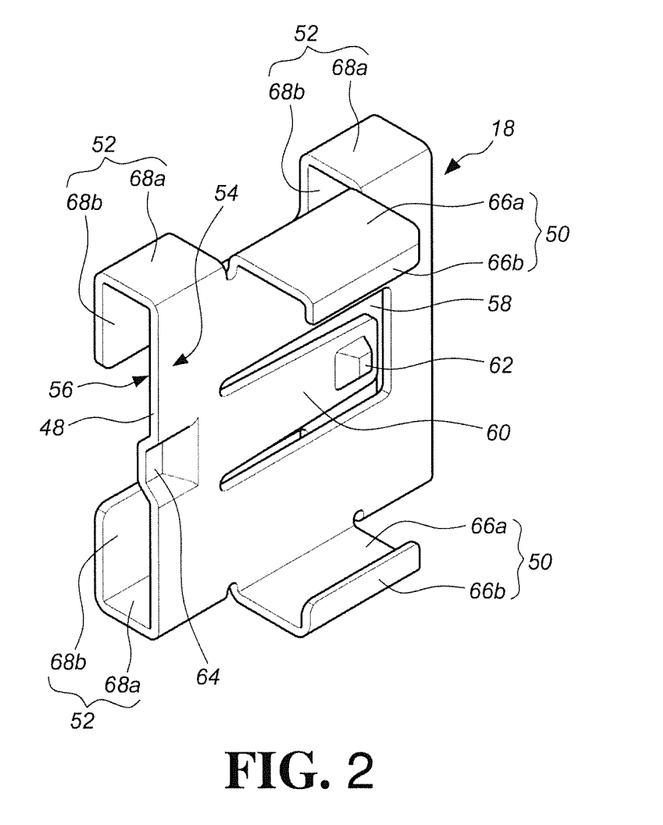
FIG. 2 shows another angle of view of the reinforcement member of the slide rail assembly of the present invention.
Figure 3:
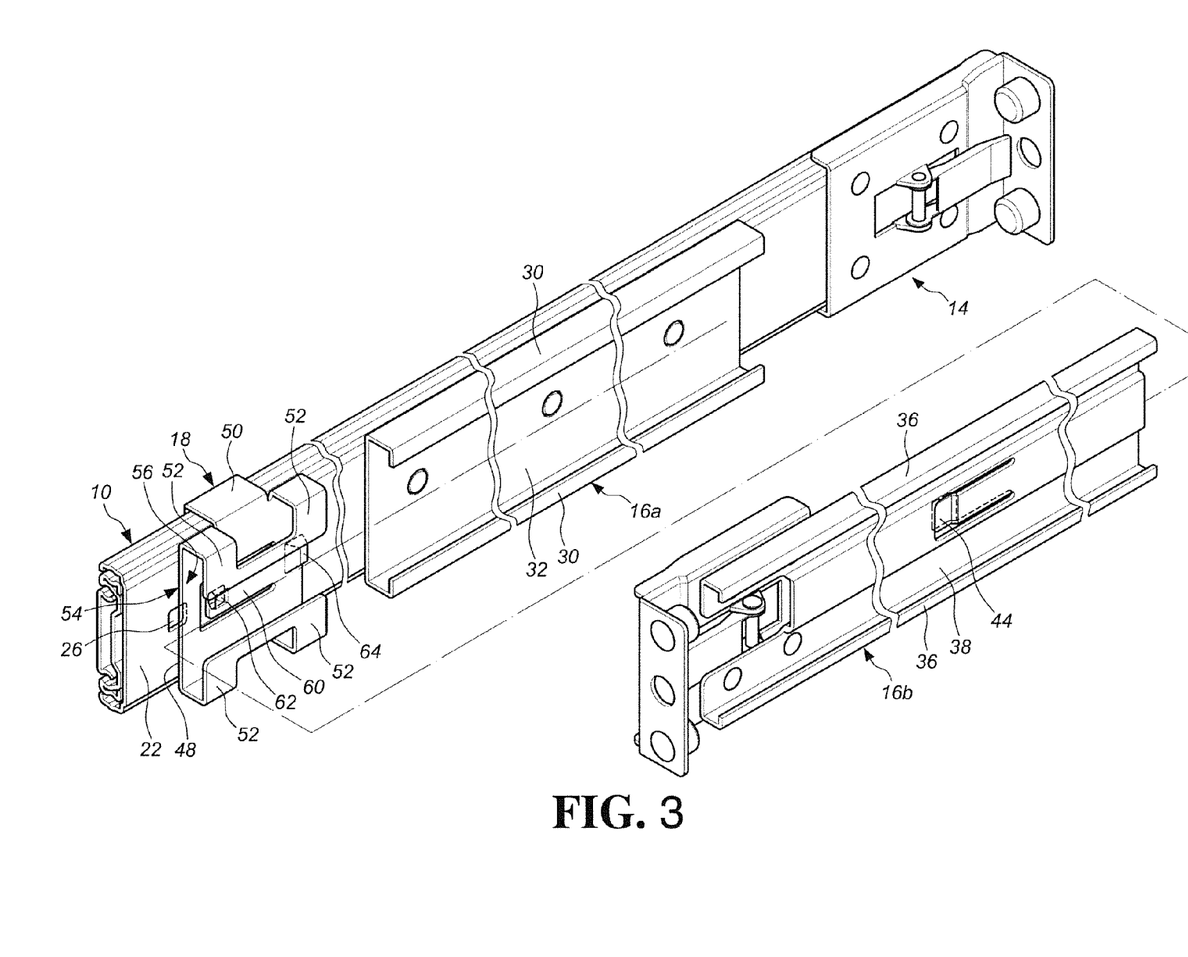
FIG. 3 shows that the reinforcement member is mounted to the outer rail.

As shown in FIG. 2, the reinforcement member 18 has a body 48, at least two first support parts 50 and at least two or more than two second support parts 52. Preferably, the at least two first support parts 50 and the at least two second support parts 52 extend from the body 48 and toward opposite directions. Wherein, the body 48 has a rear side 54 and a front side 56. Preferably, the at least two first support parts 50 extend from the body 48 and located on the rear side 54 of the body 48, and the at least two second support parts 52 extend from the body 48 and located on the front side 56 of the body 48. As shown in FIG. 3, the rear side 54 of the body 48 is located corresponding to the bridge wall 22 of the outer rail 10, and the front side 56 of the body 48 is located corresponding to the second side portion 38 of the second rear support 16b. The body 48 has a slot 58 and a contact portion 60 which extends from the body 48 and is inserted into the slot 58. Preferably, the contact portion 60 has a protrusion 62 which is configured to engage with the engaging hole 26 of the outer rail 10. The body 48 has a stop 64 which protrudes beyond the body 48. The stop 64 is located corresponding to the extension plate 44 of the second rear support 16b. Each of the at least two first support parts 50 comprises a first support plate 66a and a first bent section 66b. The first support plate 66a substantially extends perpendicularly from the body 48 of the reinforcement 18 and is located on the rear side 54 of the body 48. The first bent section 66b is bent from the first support plate 66a. Each of the at least two second support parts 52 of the reinforcement member 18 comprises a second support plate 68a and a second bent section 68b. The second support plate 68a substantially extends perpendicularly from the body 48 of the reinforcement 18 and is located on the front side 56 of the body 48. The second bent section 68b is bent from the second support plate 68a.

In practical use, as shown in FIG. 3, the reinforcement member 18 is mounted to the outer rail 10 by the at least two first support parts 50. When the protrusion 62 is moved to the engaging hole 26 of the outer rail 10, the reinforcement member 18 is engagedly positioned on the outer rail 10. Furthermore, the second rear support 16b is connected to the outer rail 10 by the at least two second support parts 52. As shown in FIG. 4, when the protrusion 62 of the contact portion 60 of the reinforcement member 18 is engaged with the engaging hole 26 of the outer rail 10 and positioned at the rear end of the outer rail 10, and when the second rear support 16b is extended to its extreme position relative to the first rear support 16a, the extension plate 44 of the second rear support 16b contacts the stop 64 of the reinforcement member 18 so as to stop the second rear support 16b. The at least two first support parts 50 is mounted to the outer rail 10, and the at least two second support parts 52 is mounted to the second support 16b. Preferably, the at least two first support parts 50 embrace the side walls 20 of the outer rail 10, and the at least two second support parts 52 movably embrace the two second support portions 36 of the second rear support 16b.

As shown in FIG. 4, the front support 14 and the second rear support 16b are respectively connected to the front post 72a and the rear post 72b of the rack 70. The length of the second rear support 16b relative to the first rear support 16a can be adjusted according the installation need so as to install the slide rail assembly to the front post 72a and the rear post 72b of the rack 70 by the use of the front support 14, the first rear support 16a and the second rear support 16b. Wherein, at a maximum extended position, the second rear support 16b is extended to its maximum distance relative to the first rear support 16a, the longitudinal length of the overlapped portions between the second rear support 16b and the first rear support 16a is reduced to the minimum, so that the support strength supported from the first rear support 16a to the second rear support 16b is reduced. Consequently, the support strength between the outer rail 10 and the second rear support 16b is reduced. The present invention uses the reinforcement member 18 to be mounted to the outer rail 10 and the second rear support 16b to reinforce the connection between the outer rail 10 and the second rear support 16b. Therefore, the slide rail assembly has sufficient support strength at the maximum extended position.

Figure 5:
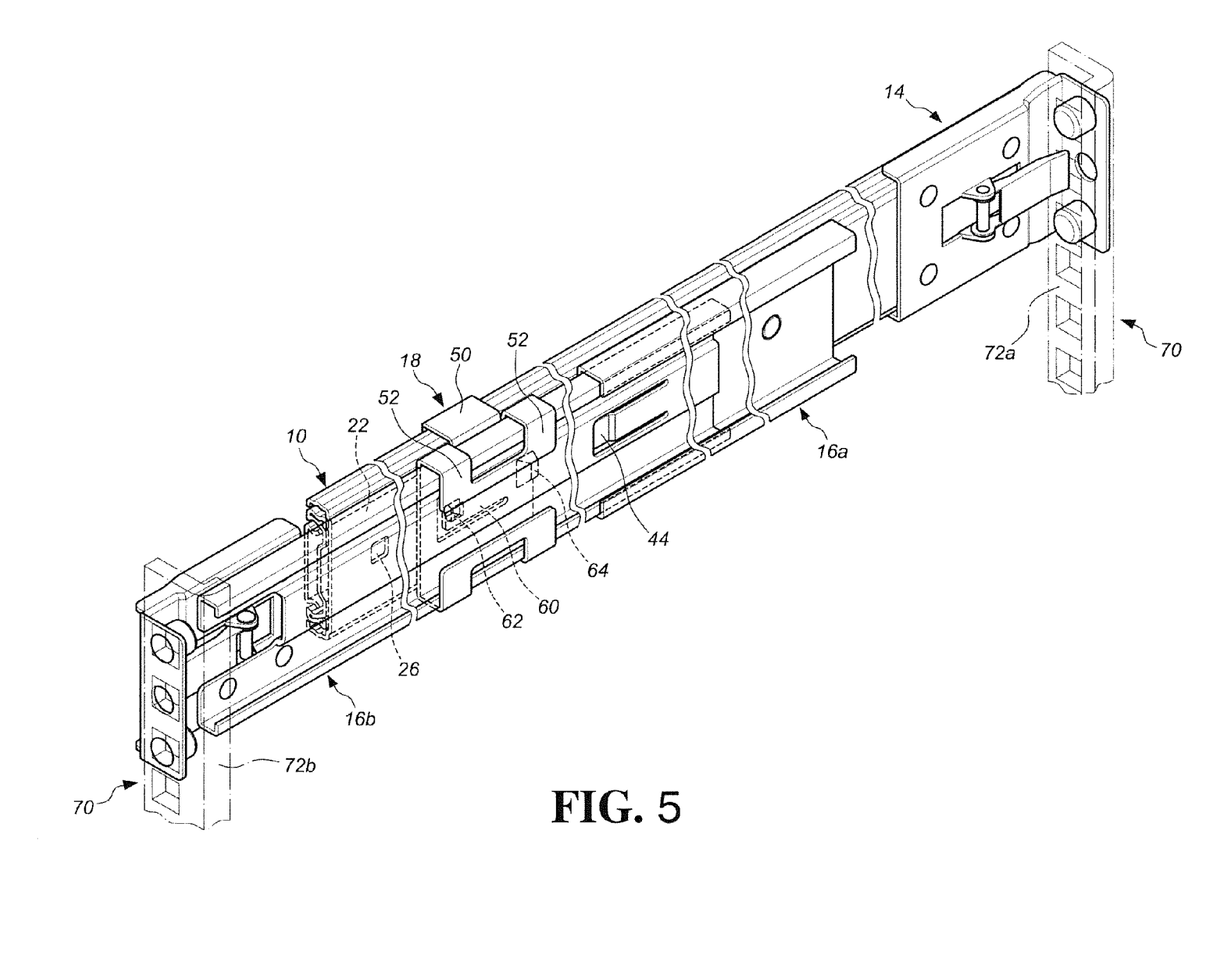
FIG. 5 shows that the slide rail assembly is installed to a rack and the reinforcement member is adjusted to move a distance.

As shown in FIG. 5, when the second rear support 16b is retracted to a distance relative to the first rear support 16a, the extension plate 44 of the second rear support 16b is away from the stop 64 of the body 48 of the reinforcement member 18. The reinforcement member 18 is freely adjusted to remove the protrusion 62 from the engaging hole 26. By the contact between the contact portion 60 (such as the protrusion 62 on the contact portion 60) of the reinforcement member 18 and the bridge wall 22 of the outer rail 10, the reinforcement member 18 can be positioned. Preferably, the reinforcement member 18 is tight positioned by the contact between the contact portion 60 and the bridge wall 22.

Figure 6:
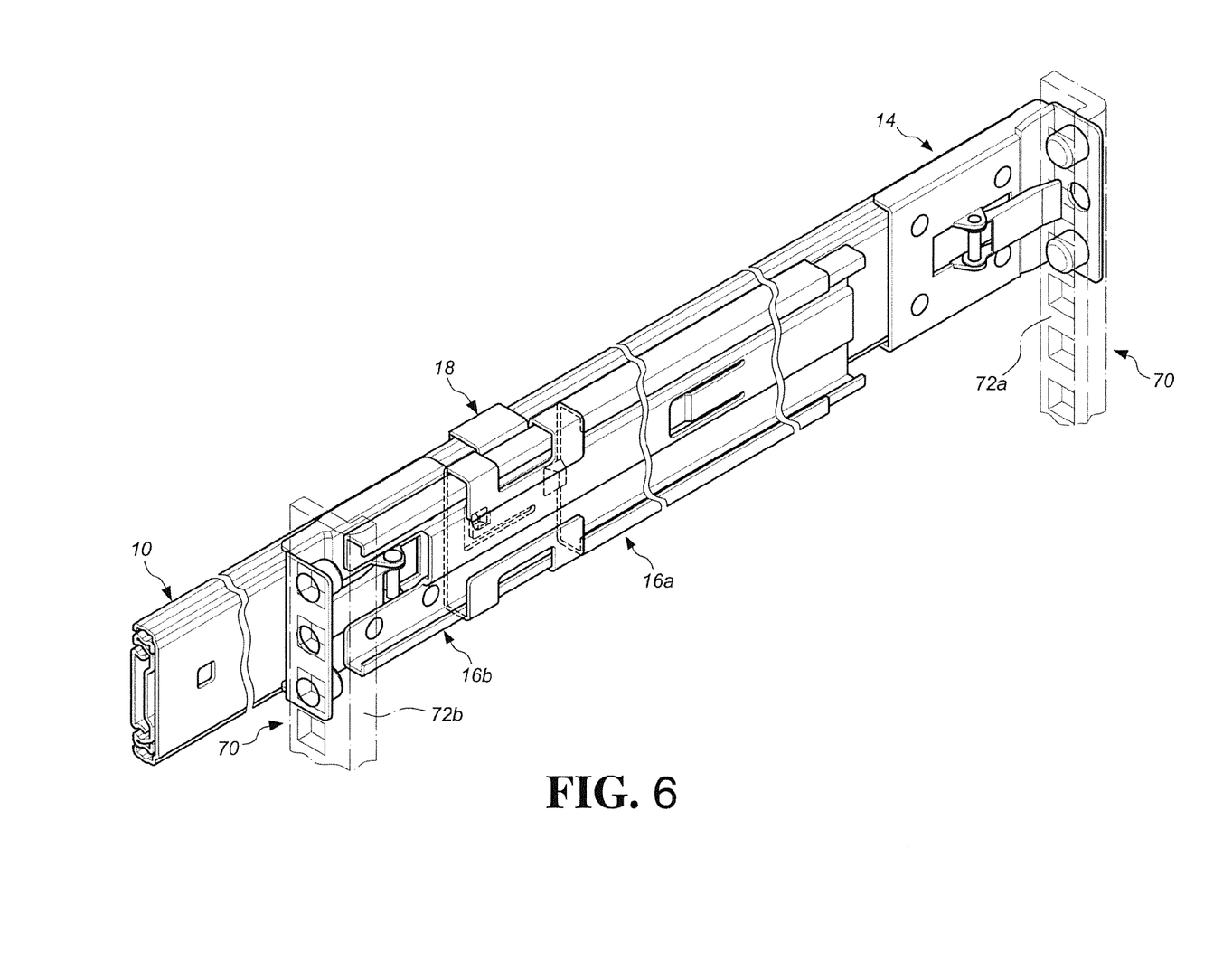
FIG. 6 shows that the slide rail assembly is installed to a rack and the reinforcement member is in contact with the first rear support.

As shown in FIG. 6, when the second rear support 16b is completely retracted relative to the first rear support 16a, the reinforcement member 18 is pushed by the second rear support 16b to contact the first rear support 16a. Under the status, the total length of the slide rail assembly, involving the reinforcement member 18, can be retracted to the minimum.

Furthermore, the reinforcement member 18 can be detached from the second rear support 16b and the outer rail 10, so that in the embodiment without the reinforcement member 18, the second rear support 16b can be directly retracted to the first rear support 16a to shorten the total length of the slide rail assembly. Consequently, the slide rail assembly can be installed to a rack with shorter depth. The embodiment is not shown in the drawings because this embodiment has been disclosed in the prior arts.

The present invention can be installed to different racks of different longitudinal depths, and the slide rail assembly has a strong and sufficient support strength by the reinforcement member 18.

While we have shown and described the embodiment in accordance with the present invention, it should be clear to those skilled in the art that further embodiments may be made without departing from the scope of the present invention.

What is claimed is:

1. A slide rail assembly comprising:
   an outer rail having a longitudinal length and two side walls connected two sides of the outer rail, a bridge wall connected between the two side walls, a longitudinal path defined between the two side walls and the bridge wall;
   an inner rail slidably connected to the longitudinal path of the outer rail;
   a front support connected to a front end of the outer rail and secured to the bridge wall;
   a first rear support fixedly installed to the bridge wall of the outer rail and having two first support portions and a first side portion being connected between the two first support portions, a first path defined between the insides of the two first support portions and the first side portion;
   a second rear support movably located in the first path of the first rear support, the second rear support having two second support portions and a second side portion being connected between the two second support portions, and
   a reinforcement member having a body, two first support parts and at least two second support parts, the two first support parts and the at least two second support parts extending from the body and toward opposite directions, the two first support parts connected to the outer rail and embracing the two side walls, the at least two second support parts connected to the second rear support and embracing the two second support portions.

2. The slide rail assembly as claimed in claim 1, wherein an engaging hole is defined in a rear end of the bridge wall of the outer rail, the body of the reinforcement member has a slot and a contact portion which extends from the body and is inserted into the slot, the contact portion has a protrusion which is engaged with the engaging hole of the outer rail.

3. The slide rail assembly as claimed in claim 1, wherein the second side portion of the second rear support has a side hole and an extension plate extends from the second side portion and is inserted into the side hole, the body of the reinforcement member has a stop which contacts the extension plate of the second rear support.

4. The slide rail assembly as claimed in claim 1, wherein each of the first support parts of the reinforcement member comprises a first support plate and a first bent section, the first support plate substantially extends perpendicularly from the body of the reinforcement and is located on a rear side of the body, the first bent section is bent from the first support plate.

5. The slide rail assembly as claimed in claim 4, wherein each of the at least two second support parts of the reinforcement member comprises a second support plate and a second bent section, the second support plate substantially extends perpendicularly from the body of the reinforcement and is located on a front side of the body, the second bent section is bent from the second support plate.

6. A slide rail assembly for use in a rack system, comprising:
   a slide rail assembly comprising an outer rail, an inner rail and an intermediate rail; the outer rail having a longitudinal length and two side walls connected two sides of the outer rail, a bridge wall connected between the two side walls, a longitudinal path defined between the two side walls and the bridge wall; the inner rail slidably connected to the longitudinal path of the outer rail; the intermediate rail slidably connected between the inner rail and the outer rail;
   a front support connected to a front end of the outer rail;
   a first rear support fixedly installed to the bridge wall of the outer rail and having two first support portions and a first side portion being connected between the two first support portions, a first path defined between the insides of the two first support portions and the first side portion;
   a second rear support movably located in the first path of the first rear support, the second rear support having two second support portions and a second side portion being connected between the two second support portions, and
   a reinforcement member having a body, two first support parts and at least two second support parts, the body having a rear side and a front side, the rear side of the body located corresponding to the bridge wall of the outer rail, the front side of the body located corresponding to the second side portion of the at least two second support parts, the body of the reinforcement member having a slot and a contact portion which extends from the body and is inserted into the slot, the first support parts embracing the two side walls of the outer rail, the two first support parts extending from the outer rail and located on the rear side of the body, the at least two second support parts movably embracing the two second support portions of the second rear support, the at least two second support parts extending from the body of the reinforcement member and located on the front side of the body;

the slide rail assembly secured to the rack by connecting the front support to a front post of the rack and connecting the second rear support to a rear post of the rack, and the reinforcement member being freely adjustable, the contact portion contacting the bridge wall of the outer rail to position the reinforcement member.

7. The slide rail assembly as claimed in claim 6, wherein an engaging hole is defined in a rear end of the bridge wall of the outer rail, the contact portion has a protrusion which is engaged with the engaging hole of the outer rail.

8. The slide rail assembly as claimed in claim 6, wherein the second side portion of the second rear support has a side hole and an extension plate which extends from the second side portion and inserted into the side hole, the body of the reinforcement member has a stop which contacts the extension plate of the second rear support.

9. A slide rail assembly comprising:
an outer rail, an inner rail, a front support, a first rear support and a second rear support, the outer rail having a longitudinal length and two side walls connected two sides of the outer rail, a bridge wall connected between the two side walls, a longitudinal path defined between the two side walls and the bridge wall, the inner rail slidably connected to the longitudinal path of the outer rail, the front support connected to a front end of the outer rail and secured to the bridge wall, the first rear support installed to the bridge wall of the outer rail and having two first support portions and a first side portion being connected between the two first support portions, a first path defined between the insides of the two first support portions and the first side portion, the second rear support movably located in the first path of the first rear support, the second rear support having two second support portions and a second side portion being connected between the two second support portions, at least two first support parts mounted to the outer rail and embracing the two side walls of the outer rail, at least two second support parts mounted to the second rear support and embracing the two second support portions of the second rear support, and a reinforcement member, said reinforcement member having a body having a rear side and a front side; the at least two first support parts extending from the body and located on the rear side of the body, and the at least two second support parts extending from the body and located on the front side of the body.

10. The slide rail assembly as claimed in claim 9, wherein the body has a slot, a contact portion extends from the body and is inserted into the slot.

11. The slide rail assembly as claimed in claim 10, wherein an engaging hole is defined in a rear end of the bridge wall of the outer rail, the contact portion has a protrusion which is engaged with the engaging hole of the outer rail.

12. The slide rail assembly as claimed in claim 9, wherein the body has a stop which protrudes beyond the body.

13. The slide rail assembly as claimed in claim 12, wherein the second side portion of the second rear support has a side hole and an extension plate which extends from the second side portion and inserted into the side hole, the stop contacts the extension plate of the second rear support.

14. A rack system comprising:
a rack and a slide rail assembly, the rack comprising a front post and a rear post, the slide rail assembly comprising an outer rail, an inner rail, an intermediate rail, a front support, a first rear support and a second rear support, the outer rail having a longitudinal length and two side walls connected two sides of the outer rail, a bridge wall connected between the two side walls, a longitudinal path defined between the two side walls and the bridge wall, the inner rail slidably connected to the longitudinal path of the outer rail, the intermediate rail slidably connected between the inner rail and the outer rail, the front support connected to a front end of the outer rail, the first rear support installed to the bridge wall of the outer rail and having two first support portions and a first side portion being connected between the two first support portions, a first path defined between the insides of the two first support portions and the first side portion, the second rear support movably located in the first path of the first rear support, the second rear support having two second support portions and a second side portion being connected between the two second support portions, at least two first support parts mounted to the outer rail and embracing the two side walls of the outer rail, at least two second support parts movably embracing the two second support portions of the second rear support, the slide rail assembly secured to the rack by connecting the front support to the front post of the rack and connecting the second rear support to the rear post of the rack, and a reinforcement member, said reinforcement member being freely adjustable and having a body having a rear side and a front side, the at least two first support parts extending from the body and located on the rear side of the body, the at least two second support parts extending from the body and located on the front side of the body, the body having a slot and a contact portion extending from the body and inserted into the slot, the body having a stop which protrudes beyond the body, and the contact portion contacting the bridge wall of the outer rail to position the reinforcement member.

15. The rack system as claimed in claim 14, wherein an engaging hole is defined in a rear end of the bridge wall of the outer rail, the contact portion has a protrusion which is engaged with the engaging hole of the outer rail.

16. The rack system as claimed in claim 14, wherein the second side portion of the second rear support has a side hole and an extension plate extends from the second side portion and inserted into the side hole, the stop contacts the extension plate of the second rear support.

* * * * *